United States Patent
Fouts et al.

(10) Patent No.: US 7,627,003 B1
(45) Date of Patent: Dec. 1, 2009

(54) AUTOMATIC CLOCK SYNCHRONIZATION AND DISTRIBUTION CIRCUIT FOR COUNTER CLOCK FLOW PIPELINED SYSTEMS

(75) Inventors: Douglas Jai Fouts, Salinas, CA (US); Brian Lee Luke, Odenton, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 539 days.

(21) Appl. No.: 11/251,541

(22) Filed: Sep. 30, 2005

(51) Int. Cl.
*H04J 3/06* (2006.01)

(52) U.S. Cl. .................. 370/503; 370/516; 375/362; 375/371; 375/375; 375/355; 327/141; 327/144; 327/158; 327/161

(58) Field of Classification Search .......... 370/503, 370/517, 537; 327/141, 161, 163, 144, 158
See application file for complete search history.

(56) References Cited

U.S. PATENT DOCUMENTS

| | | | | |
|---|---|---|---|---|
| 5,095,233 A | * | 3/1992 | Ashby et al. ............... | 327/149 |
| 6,064,244 A | * | 5/2000 | Wakayama et al. ......... | 327/158 |
| 6,847,241 B1 | * | 1/2005 | Nguyen et al. .............. | 327/158 |
| 7,123,058 B2 | * | 10/2006 | Kim et al. ..................... | 327/90 |
| 2002/0047742 A1 | * | 4/2002 | Setogawa .................. | 327/544 |
| 2004/0189359 A1 | * | 9/2004 | Shah et al. ................... | 327/158 |

* cited by examiner

*Primary Examiner*—Aung S Moe
*Assistant Examiner*—Christopher P Grey
(74) *Attorney, Agent, or Firm*—Donald E. Lincoln; Lisa A. Norris

(57) ABSTRACT

A clock synchronization buffer for a counter clock flow pipelined circuit including a cascade of processing modules that receive data from a previous module and provide output results to a following module. The clock synchronization buffer receives a clock input signal and provides clock signals to a local processing module and to the next pipeline stage. The clock synchronization buffer includes a selectable delay stage that receives a clock input signal and a delay select signal and outputs a clock signal having a selected delay. An amplifier connected to the selectable delay stage provides the delayed clock signal to a local processing module that corresponds to the clock synchronization buffer circuit. An inverting amplifier connected to the selectable delay stage provides the delayed clock signal to the next pipeline stage. A clock synchronization controller synchronizes the phases of reference clock input and synchronized clock input signals.

4 Claims, 7 Drawing Sheets

AUTOMATIC CLOCK SYNCHRONIZATION AND DISTRIBUTION CIRCUIT FOR COUNTER CLOCK FLOW PIPELINED SYSTEMS

BACKGROUND OF THE INVENTION

1. Field of the Invention
2. Description of the Prior Art

Many electronic systems, especially but not limited to digital electronic systems, are composed of a cascade of modules where each module receives input data from one or more previous modules in the cascade, processes the received data, and then sends output results to one or more following modules in the cascade. This architecture is sometimes referred to as a pipelined system or a pipelined circuit and can be applied at the system level, the subsystem level, the component level, or even at the subcomponent level, such as inside an integrated circuit. If all modules are required to work synchronously with all other modules, a clock signal must be distributed to all modules in the system. The normal method used to distribute the clock is to systematically split the signal using buffers to form a clock distribution tree. This ensures that each module receives a clock signal that is in phase with the clock signal received by all other modules, allowing all modules to perform their processing functions at the same time.

There are two major problems with this method of splitting and distributing the clock signal. First, it requires a large number of high-power clock distribution buffers. The large number of high-power buffers consumes a large amount of electrical power, generates a large amount of heat, takes up a significant amount of space, and increases system complexity and component count, which decreases reliability and increases cost. Second, the use of a clock distribution tree does not guarantee that all modules will receive an in-phase clock signal. In fact, it practically guarantees there will be at least some skew between the different clock signals arriving at the different modules. The skew is caused by the normal variations in length and parasitic resistance, capacitance, and inductance in the different conductors that distribute the clock signal, along with the normal delay variations in the different clock buffers. These variations exist even if all conductors and clock buffers are implemented on the same integrated circuit using a physically and electrically symmetric layout. Furthermore, the more modules in the system, the more levels will be required in the clock distribution tree, and the greater will be the skew. It is important to note that all of these major disadvantages exist whenever a pipelined architecture utilizes a synchronous clock, regardless of whether the architecture is applied at the system level, the subcomponent level, or at any level in between. Unfortunately, the vast majority of pipelined electronic systems require a clock for synchronization.

An alternative method, known as counter clock flow pipelining, or, alternatively, counter clock pipelining or counter flow pipelining, for distributing the clock signal in a pipelined system or circuit has been developed. In this alternative approach the clock is distributed using multiple clock distribution buffers that are connected in a daisy-chain arrangement instead of a tree arrangement. The clock is initially distributed to the last module or circuit in the cascade of modules. The clock signal is then routed through a buffer and distributed to the preceding module in the cascade. The clock is distributed to all modules or circuits in the pipeline using this daisy-chain technique, always being distributed to a following module or circuit in the cascade before being distributed to a preceding module or circuit in the cascade. It should be noted that the distribution of the clock signal, or the clock flow, occurs in the opposite direction of the flow of data through the cascade of data processing modules, thus the name "Counter Clock Flow Pipelining."

There are four major advantages and one major disadvantage to using the counter clock flow method for distributing the clock signal in a pipelined circuit or system. The first advantage is that the clock buffers do not have to drive long clock lines that span large distances across a printed circuit board or an integrated circuit. Each buffer only has to drive the distance from one module to the next. Therefore, the clock buffer circuits do not need to be as powerful as do the clock buffer circuits used in a tree arrangement. In fact, the total amount of electrical power consumed by the counter clock flow clock distribution circuit is typically 30% less than the amount of electrical power consumed by the clock distribution circuit in a tree arrangement. Furthermore, each individual buffer circuit is physically smaller, thus providing a size advantage as well as a power consumption advantage, which can be critically important issues if all components are implemented on a single VLSI integrated circuit. Associated with the lower power consumption is also a reduction in the amount of heat generated by the clock distribution network. This can also be a significant factor for systems where all components are implemented on a single chip.

The second advantage of using counter clock flow pipelining is that it absolutely guarantees correct timing between the clock signals that arrive at adjacent modules in the pipeline. For correct operation of a pipelined system or circuit, if module A feeds data to module B, then the clock signal must arrive at module B either at the exact same time as the clock signal arriving at module A, or the clock signal must arrive at module B slightly before the clock signal arrives at module A. In a counter clock flow pipelined system or circuit, the clock signal is guaranteed to arrive at module A after it arrives at module B because of the finite delay through the clock buffer and the propagation delay along the clock wire. The more traditional clock fan out tree is an attempt to force the clock signal to arrive at all modules at exactly the same time. However, in practice, this is impossible because all clock buffers have slightly different delays, even when implemented on the same integrated circuit. Furthermore, the different wires that carry the different clock signals between the different buffers, or between the buffers and the processing modules, will also have slightly different delays. This is not a problem if the total delay from the clock input to module A is greater than the total delay from the clock input to module B. However, in the tree arrangement, this cannot be guaranteed.

The third advantage of using counter clock flow pipelining is that the output data from the last stage of processing is guaranteed to be synchronized with the incoming clock signal. This is because the incoming clock signal is immediately applied to the last module in the cascade of modules, without going through any delay-causing buffers. If the output data of the pipelined system or circuit is to be applied to another circuit or subsystem module that is being synchronized by the same clock signal, then it is critical for the output data to be synchronized with the incoming clock signal. If they are not synchronized, a wide variety of difficult problems can occur, such as switching hazards, races, and metastability problems. All these problems can be avoided by keeping the output data from the last stage of the pipelined system or circuit synchronized with the incoming clock signal. However, this can be very difficult to accomplish using a tree structured clock distribution scheme.

The fourth major advantage is the elimination of current surges on the power and ground supply rails. In a traditional pipelined system that utilizes a traditional clock fanout tree where are modules are clocked at exactly the same time or at nearly the same time, a large surge of current flows through both the power and ground supply rails when the clock signal transitions. This can cause a large number of problems such as noise margin degradation, cross talk, and timing and skew problems. With counter clock flow pipelining, no two modules in the pipeline are clocked at exactly the same time, limiting the power and ground rail surge current to the amount of surge current drawn by a single module.

There is one significant disadvantage to the clock distribution method. The data input signal coming into the first data processing module in the pipeline is not synchronized with the clock signal that is applied to that module. This is because the input clock signal applied to the pipeline goes through a large number of clock buffers before it is applied to the first data processing module in the pipeline. These buffers cause delay, as do the wires that interconnect the clock buffers. Furthermore, the exact amount of delay is very difficult to predict in advance. When the data input to the first data processing module is out of phase with the clock signal applied to that stage, a wide variety of difficult problems can occur, including switching hazards, races, and metastability problems. The only know solution to this problem is to manually measure the skew after implementation and manually adjust the skew by adding delay at the clock input to the pipeline. However, this causes skew between the output data from the last module in the pipeline and the input clock signal. Essentially, the skew problem between the input data to the pipeline and the clock signal applied to the first module works against the skew problem between the output data from the last module in the pipeline and the input clock signal. This disadvantage is so significant that it has prevented the widespread adoption of the counter clock flow pipelined architecture.

SUMMARY OF THE INVENTION

This invention address the major problem discussed at the end of the previous section that has prevented the widespread adoption of counter clock flow pipelining. Specifically, a method has been invented to automatically synchronize the output clock signal from the first module or stage of a counter clock flow pipelined system or circuit with the input data to the first module. The invention comprises two new clock buffer circuits, a new clock synchronization control circuit, and a method for applying these circuits in a counter clock flow pipelined system or circuit.

This invention is directed to a clock synchronization buffer circuit for use with a counter clock flow pipelined circuit that includes a cascade of processing modules in which each processing module receives input data from a previous module in the cascade, processes the received data and then sends output results to a following module in the cascade. The clock synchronization buffer circuit is arranged to receive a clock input signal and to provide clock output signals to a local processing module and to the next pipeline stage. The clock synchronization buffer circuit includes a selectable delay stage arranged to receive a clock input signal and a delay select signal and to output a delayed clock signal having a selected delay. A first amplifier that is a non inverting amplifier is connected to the selectable delay stage and arranged to provide the delayed clock signal to a local processing module that corresponds to the clock synchronization buffer circuit. A second amplifier that is an inverting amplifier is connected to the selectable delay stage and arranged to provide the delayed clock signal to the next pipeline stage.

The first amplifier may be an inverting amplifier instead of a non-inverting amplifier as provided above.

The invention also includes an automatic clock synchronization controller circuit for use with a counter clock flow pipelined circuit that includes a cascade of processing modules in which each processing module receives input data from a previous module in the cascade, processes the received data and then sends output results to a following module in the cascade, the automatic clock synchronization controller circuit being arranged to receive two clock input signals, one a synchronized clock and the other a reference clock, and to provide a plurality of output signals to control the selectable delay of a plurality of clock synchronization buffers. The automatic clock synchronization controller circuit may include a phase comparator with two inputs and two outputs, one input being for a synchronized clock signal and the other input being for a reference clock signal, one output being to indicate when the two clock signals are in phase and when they are out of phase and the second output being used to indicate if the phase of the synchronized clock signal leads or lags the phase of the reference clock signal in the event the two signals are out of phase. The automatic clock synchronization controller circuit may further include a finite state machine with two inputs and two outputs, one input coming from the phase comparator and being used to indicate when the two clock signals are in phase or out of phase and the other input also coming from the phase comparator and being used to indicate if the phase of the synchronized clock leads or lags the phase of the reference clock in the event the two clock signals are out of phase, one output going to a phase adjuster circuit and being used to indicate if an increase in delay is needed and the other output also going to the phase adjuster circuit and being used to indicate if a decrease in delay is needed. The automatic clock synchronization controller circuit also includes a phase adjuster circuit that has two inputs and a plurality of outputs, one input coming from the finite state machine and being used to indicate if the total amount of delay needs to be increased and the other input also coming from the finite state machine and being used to indicate if the total amount of delay needs to be decreased, and the plurality of outputs going to the delay select inputs of the clock synchronization buffers used to distribute the input clock signal to the cascade of local processing modules with one output from the phase adjuster going to each of the clock synchronization buffers.

The invention also includes a method for connecting together a counter clock flow pipelined circuit that includes a cascade of processing modules in which each processing module receives input data from a previous module in the cascade, processes the received data and then sends output results to a following module in the cascade, together with one or more of the non inverting clock synchronization buffers. The method also includes the step of connecting to the pipelined circuit, one or more of the inverting clock synchronization buffers and the automatic clock synchronization controller in such a manner as to cause the automatic synchronization between the clock signal input to the last module of the cascade of pipelined modules with the clock signal input to the first module of the cascade of pipelined modules.

DETAILED DESCRIPTION OF THE INVENTION

Figure 1:
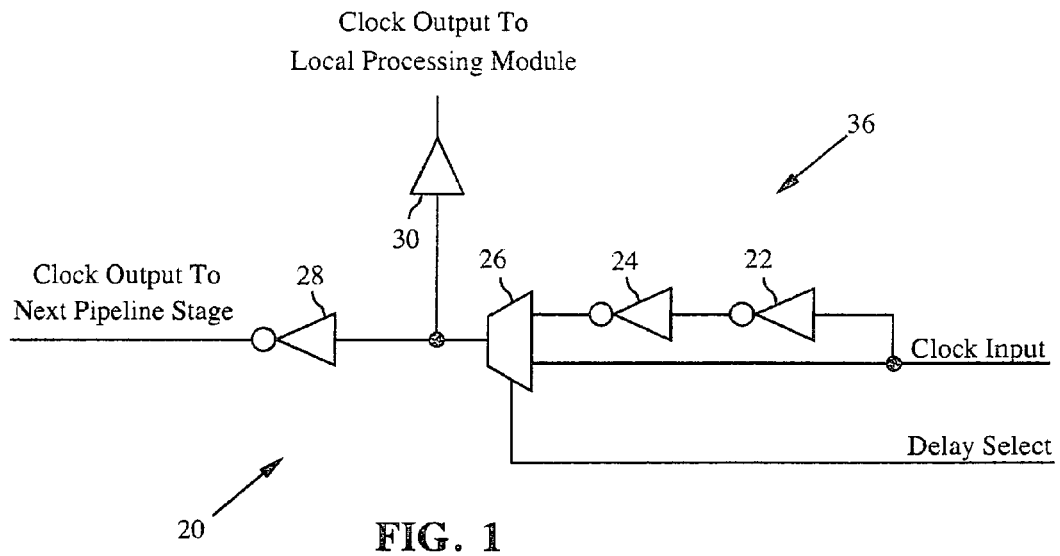
FIG. 1 is a schematic diagram of a first clock buffer circuit according to the present invention.

FIG. 1 illustrates a non-inverting clock synchronization buffer circuit 20 according to the present invention. A pair of inverters 22 and 24 is connected in series with the output of the inverter 24 being connected to a first input of a multiplexer 26. A Clock Input signal is input to the inverter 22 and to a second input of the multiplexer 26. A Delay Select signal is input to a third input of the multiplexer 26. The signal output from the multiplexer 26 is input to an inverting amplifier 28, which provides a Clock Output signal to a next pipeline stage (not shown in FIG. 1). The signal output from the multiplexer 28 is also input to a non-inverting amplifier 30, which provides a Clock Output signal to a local processing module (not shown in FIG. 1).

Figure 2:
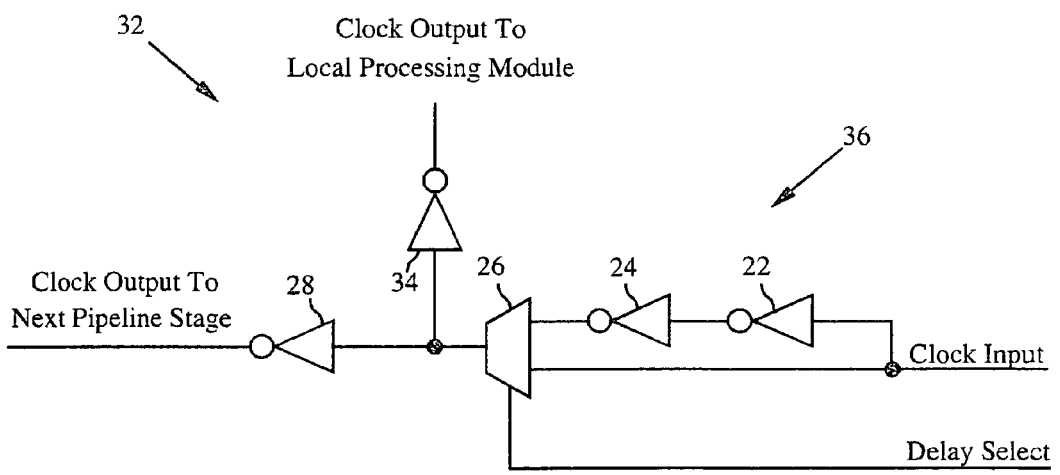
FIG. 2 is a schematic diagram of a second clock buffer circuit according to the present invention.

FIG. 2 illustrates an inverting second clock synchronization buffer circuit 32 that is similar to the clock buffer circuit 20 with the only difference being that in the inverting clock synchronization buffer circuit has an inverting amplifier 34 instead of the non-inverting amplifier 30.

Referring to FIGS. 1 and 2, the clock signal first travels through a selectable delay stage 36. This is in direct contrast to prior art clock buffer circuits that do not have a selectable delay stage. As shown in FIGS. 1 and 2, the delay stage 36 is created using the pair of inverters 22 and 24, but any method for creating clock delay can be used. After passing through the selectable delay stage 36, the clock signal is then split after passing through the multiplexer 26, as indicated in FIGS. 1 and 2. Part of the split signal is sent on to the next module or stage of the pipeline. The other part of the split clock signal is sent to the local data processing module or circuit. The clock signal can be split passively, as shown in FIGS. 1 and 2, or with an active circuit (not shown). Splitting the clock signal inside the buffer is a novel feature of the present invention. With prior art clock distribution buffers, the signal is split after the buffer. After splitting, the clock signal that is sent on to the next pipeline module or stage is amplified by the inverting amplifier 28. This is in contrast to prior-art clock buffer circuits that use either non-inverting amplifiers or two inverting amplifiers in series that provide the same function as a non inverting amplifier.

The clock signal that is sent to the local data processing module or circuit is amplified with either a non-inverting amplifier 30 as shown in FIG. 1 or an inverting amplifier 34 as shown in FIG. 2. Typically the amplifier 28 that distributes the clock signal to the next pipeline module or stage is more powerful than the amplifier 30 or 34 that distributes the clock signal to the local processing module. However, in some implementations, the amplifiers may have the same power or the amplifier that distributes the clock signal to the local processing module may be more powerful.

Figure 3:
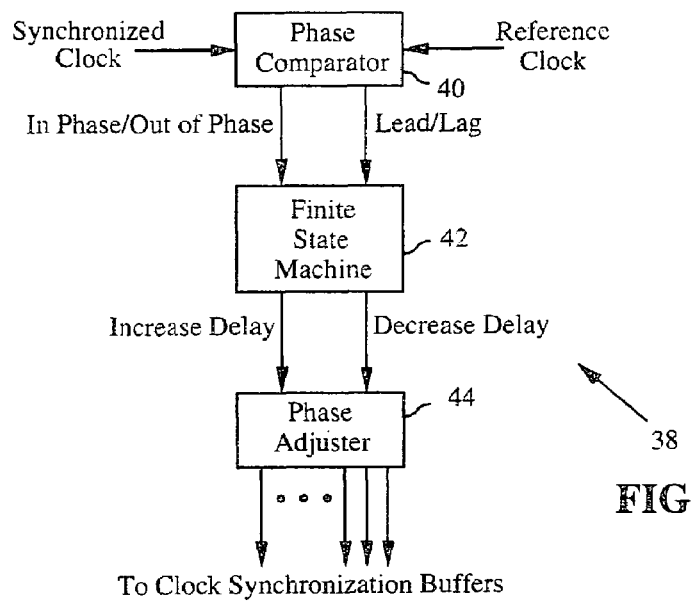
FIG. 3 is a block diagram of an automatic clock synchronization controller.

A schematic diagram of an automatic clock synchronization controller 38 is shown in FIG. 3. The automatic clock synchronization controller 38 comprises a phase comparator 40 that is connected to a finite state machine (FSM) 42. A phase adjuster 44 is connected to the FSM 42 and arranged to receive signals therefrom. The phase comparator 40 receives a synchronized clock signal and a reference clock signal. The phase comparator 40 compares the phase of the reference clock signal against the phase of the synchronized clock signal. If the phase difference between these two signals is less than half the amount of selectable delay in the clock synchronization buffers, then the phase comparator 40 indicates to the FSM 42 that the two signals are in phase.

If the phase difference between the two signals is greater than the selectable delay in the clock synchronization buffers, then the phase comparator 40 indicates to the FSM 42 that the two signals are out of phase. In this case, the phase comparator 40 also tells the FSM 42 if the phase of the synchronized clock leads or lags the phase of the reference clock. The FSM 42 receives the signals output by the phase comparator 40 and decides weather or not to adjust the phase of the synchronized clock signal. If the phase of the synchronized clock leads the phase of the reference clock, the FSM 42 will instruct the phase adjuster 44 to switch in additional delay. If the phase of the synchronized clock lags the phase of the reference clock, the FSM 42 will instruct the phase adjuster 44 to switch out delay. The FSM 42 then goes into a wait state until the clock phase change has had time to propagate through all of the clock synchronization buffers. The phase adjuster 44 receives the signals from the FSM 42 to either increase delay, decrease delay, or do nothing. If it receives a signal to increase delay it locates a clock synchronization buffer that does not currently have delay switched in and instructs that buffer to switch in delay. If it receives a signal to decrease delay it locates a clock synchronization buffer that currently has delay switched in and instructs the buffer to switch the delay out.

Figure 4:
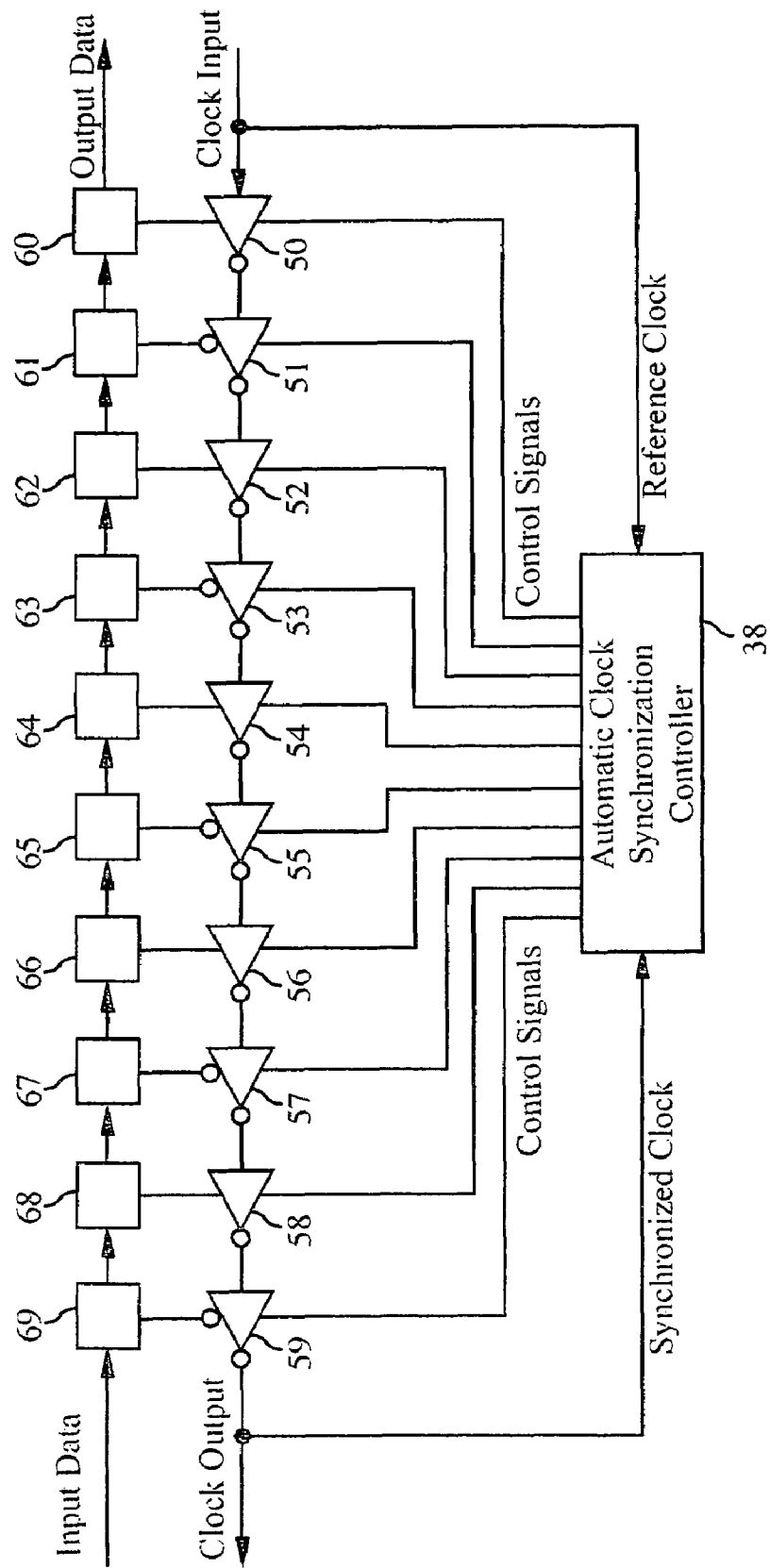
FIG. 4 illustrates a circuit for applying both inverting and non-inverting clock synchronization buffers and the automatic clock synchronization controller.

FIG. 4 shows the automatic clock synchronization controller 38 and a plurality of clock synchronization buffer circuits 50-59 connected in a cascade array with a plurality of data processing modules 60-69. Referring to FIG. 4, the Clock Input signal is split such that it is distributed to the clock synchronization buffer 50, which is the non-inverting type as shown in FIG. 1, and to the reference clock input of the automatic clock synchronization controller 38. The outputs of the clock synchronization buffer circuit 50 go to the local data processing module 60 and to the next clock synchronization buffer 51 in the cascade. However, the next clock synchronization buffer in the cascade is an inverting clock synchronization buffer of the type shown in FIG. 2 instead of a non-inverting clock synchronization buffer. As the clock signal is distributed from one stage to the next, inverting and non-inverting buffers are alternated, as shown in FIG. 4. The output of the last clock synchronization buffer 59 is split, and the signal is distributed to the synchronized clock input to the automatic clock synchronization controller and to the module or circuit that provides the synchronous data to the input of the first data processing module or circuit in the pipeline, as indicated in FIG. 4.

Figure 5:
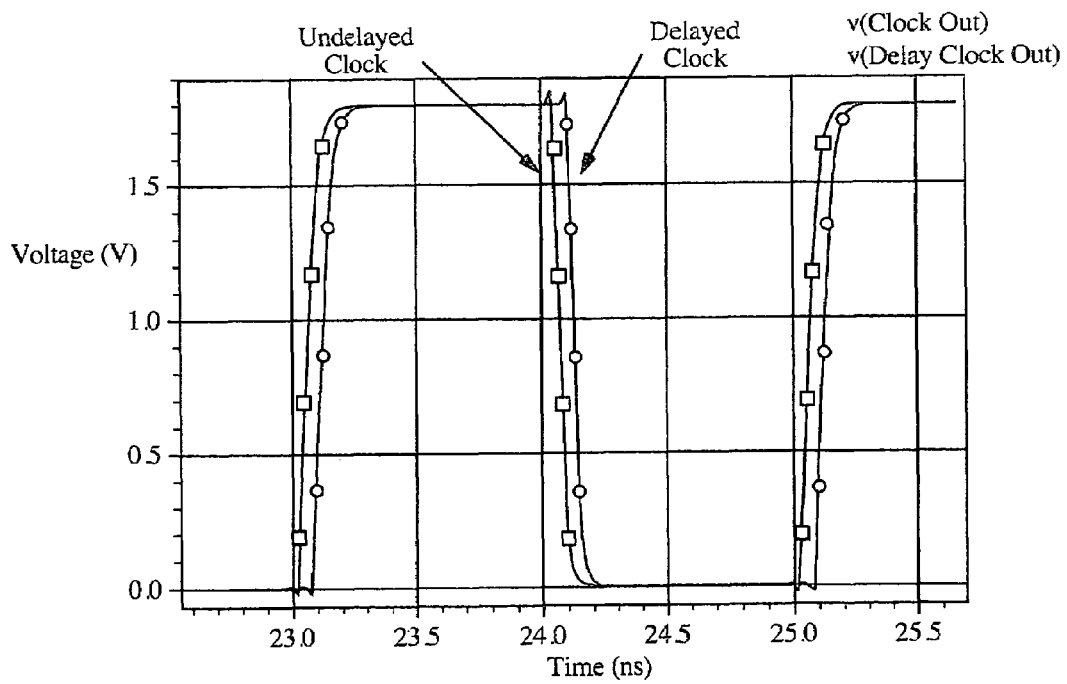
FIG. 5 graphically illustrates a typical delay associated with a clock synchronization buffer delay circuit.

When the clock synchronization buffers 20 and 32 are used in a circuit of the type shown in FIG. 4, the resolution of the clock phase adjustment will be determined by the amount of delay created by the selectable delay stage within each clock synchronization buffer. FIG. 5 shows the typical amount of delay desired. In FIG. 5, the clock period is 2 ns and the delay is approximately 58 ps, which is about 3% of the clock period.

Figure 6:
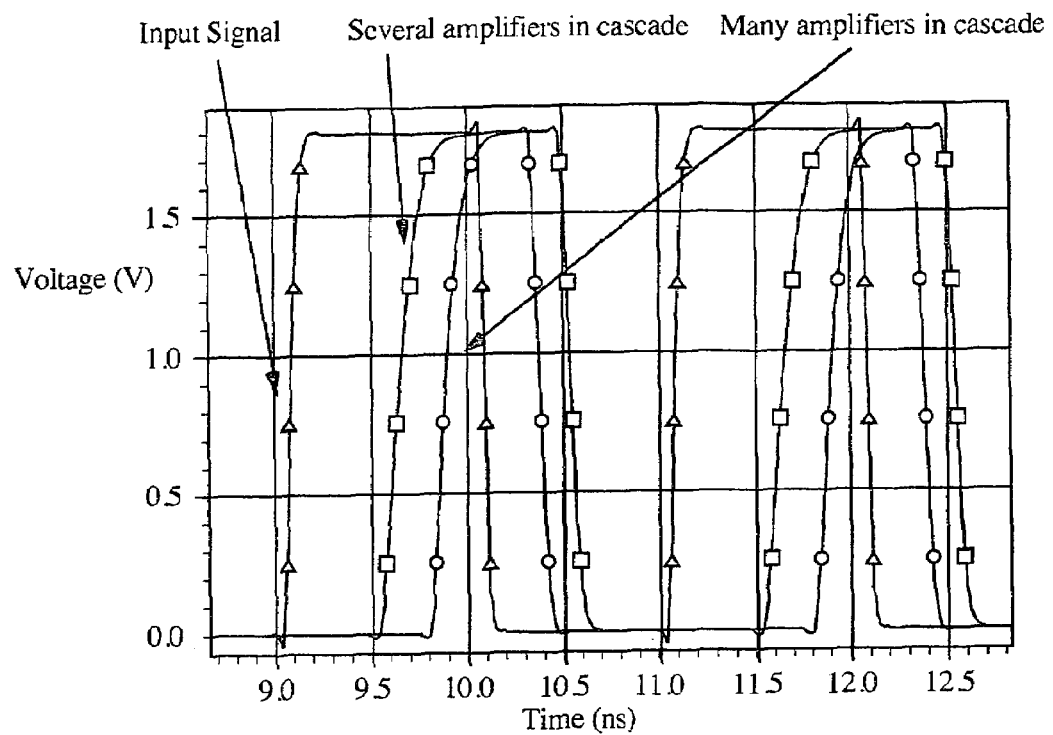
FIG. 6 graphically illustrates disadvantages of using a non-inverting amplifier in a clock buffer.
Figure 7:
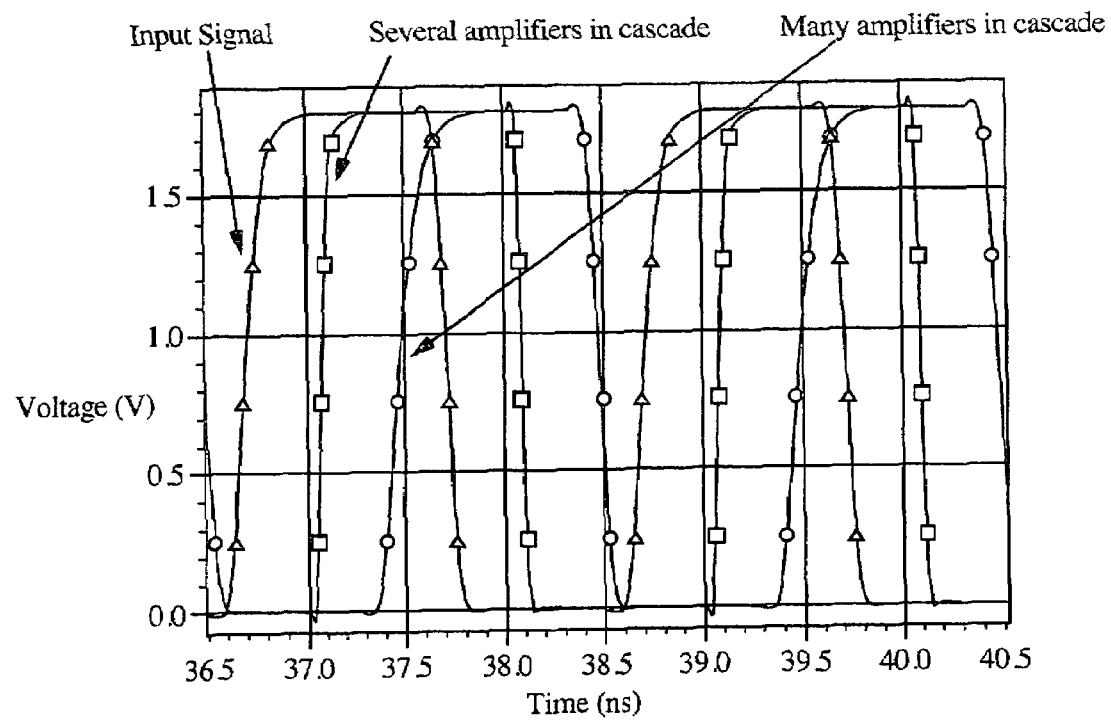
FIG. 7 graphically illustrates an advantage of using an inverting amplifier in a clock buffer.

The advantage of using the inverting amplifier 28 in the clock synchronization buffer circuits 20 and 32 for distributing the clock signal to the next clock buffer in the cascade can be seen by referring to FIGS. 6 and 7. FIG. 6 shows the results of amplifying a clock signal with a non-inverting amplifier. After passing through only a few cascaded amplifiers, the clock signal has become distorted. The length of time the clock signal is high is noticeably shorter than the length of time the clock signal is low. This is in contrast to the input signal where the time high and time low are exactly equal. This problem is caused by parasitic capacitance on the output node of the amplifier. Unfortunately, the parasitic capacitance is inherent to all electronic interconnects whether it's at the system, subsystem, or component level. Even if the interconnect is connecting together two clock buffers on the same integrated circuit, there is still enough parasitic capacitance to distort the clock waveform. After passing through many cascaded amplifiers, the signal is extremely distorted and the length of time the clock signal is high is extremely short relative to the time the signal is low, as can be seen in FIG. 6. This is a serious problem and frequently leads to the failure of the circuit the clock signal is driving and/or the next clock buffer in the cascade. Furthermore, this situation is often made significantly worse because in a counter clock flow pipelined circuit or system, the clock signal will get amplified by hundreds and possibly even thousands of cascaded clock buffers. FIG. 7 shows the results of amplifying a clock signal with an inverting amplifier. There is no shortening of the clock pulse. The input waveform looks exactly the same after passing through a few cascaded buffers or after passing through many cascaded buffers.

Referring again to FIG. 3, one of the key features the phase comparator 40 must have is that it must not indicate an out of phase condition if the phase difference between the synchronization clock signal and the reference clock signal is less than half the amount of selectable delay in the clock synchronization buffers 20 and 32. In this case, the phase comparator 40 must indicate to the FSM 42 that the two signals are in phase. If the phase difference between the two signals is greater than half the amount of selectable delay in the clock synchronization buffers 20 and 32, then the phase comparator 40 indicates to the FSM 42 that the two signals are out of phase. In this case, the phase comparator 40 also tells the FSM 42 if the phase of the synchronized clock leads or lags the phase of the reference clock.

Figure 8:
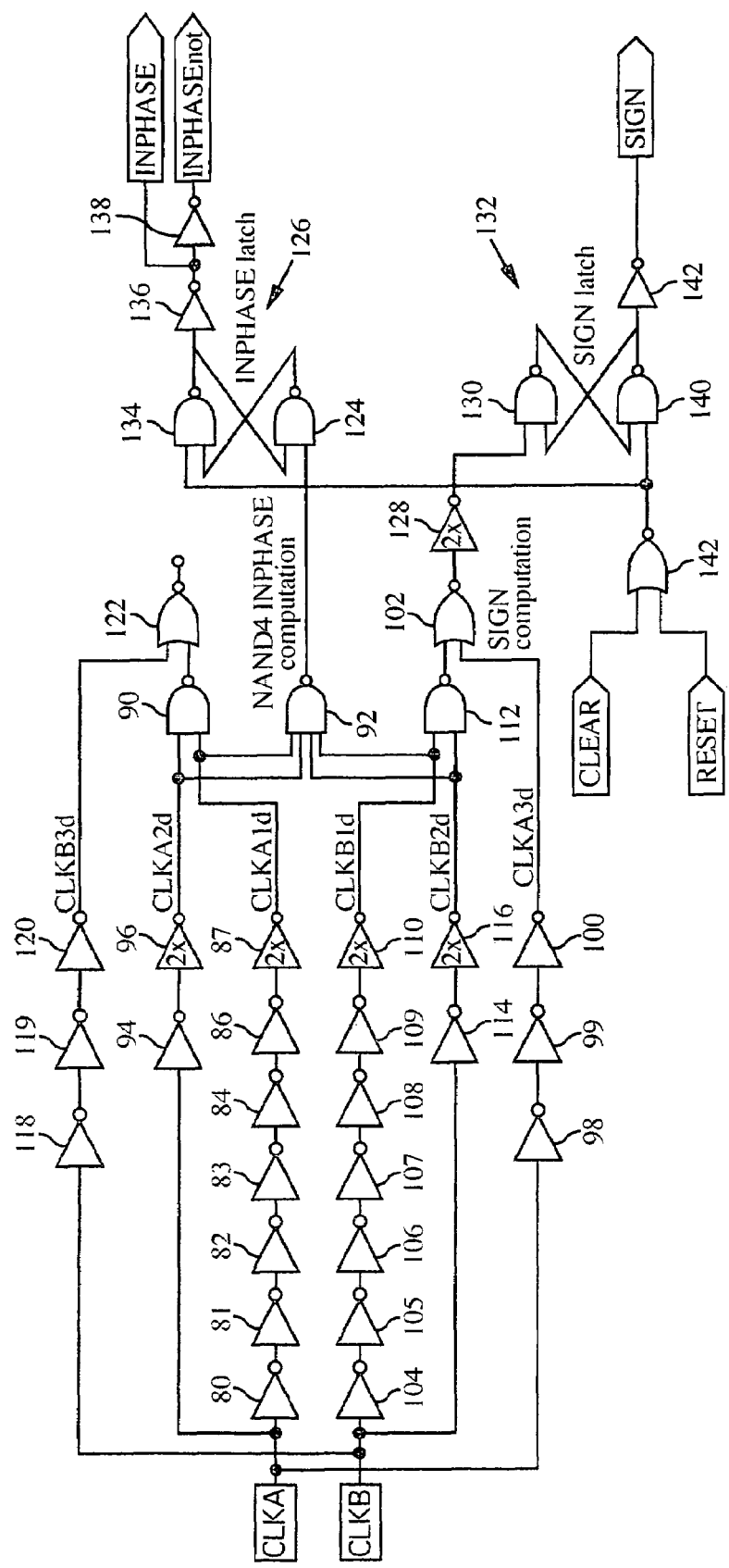
FIG. 8 is a diagram of a phase comparator circuit.

A detailed schematic diagram of the phase comparator circuit 40 is shown in FIG. 8. The phase comparator circuit 40 shown in FIG. 8 has output signals that indicate both the in-phase condition and the out-of-phase condition. This facilitates implementation of the FSM 42. In FIG. 8, the signal for the in-phase condition is labeled "INPHASE," and the signal for the out-of-phase condition is labeled "INPHASEnot." However, for proper operation, this circuit also requires "RESET" and "CLEAR" inputs. These control signal inputs to the phase comparator come from the FSM. In FIG. 8, the output signal labeled "SIGN" indicates phase lag or phase lead.

Clock signals to be compared by the phase comparator 40 are identified as CLKA and CLKB. The CLKA signal is split into three portions. A first portion of the CLKA signal is input to a series connection of inverting amplifiers 80-87. The amplifier 87 outputs an amplified signal labeled CLKA1d that is split and input to a first input of a NAND gate 90 and a first input of a NAND gate 92.

A second portion of the CLKA signal is input to an inverting amplifier 94 that is connected in series with an inverting amplifier 96. The amplifier 96 provides an amplified signal labeled CLKA2d, which is split and input to a second input of the NAND gate 90 and a second input of the NAND 92.

A third portion of the CLKA signal is input to series connection of inverting amplifiers 98-100. The amplifier 100 provides an amplified signal labeled CLKA3d, which is input to a NOR gate 102.

The CLKB signal is also split into three portions. A first portion of the CLKB signal is input to a series connection of inverting amplifiers 104-110. The amplifier 110 outputs an amplified signal labeled CLKB1d that is split and input to the NAND gate 92 and into a NAND gate 112.

A second portion of the CLKB signal is input to an inverting amplifier 114 that is connected in series with an inverting amplifier 116. The amplifier 116 provides an amplified signal labeled CLKB2d, which is split and input to the pair of AND gates 92 and 112.

A third portion of the CLKB signal is input to series connection of inverting amplifiers 118-120. The amplifier 120 provides an amplified signal labeled CLKA3d, which is input to a NOR gate 122.

Signals output from the NAND gate 90 are input to the NOR gate 122. Signals output from the NAND gate 92 are input to a NAND gate 124 that is included in an inphase latch circuit 126. Signals output from the NAND gate 102 are amplified by an inverting amplifier 128 and then input to a NAND gate 130 that is included in a sign latch circuit 132.

The inphase latch 126 also includes a NAND gate 134. Each of the NAND gates 124 and 134 has an input connected to the output of the other. The NAND gate 134 also receives amended CLEAR and RESET signals from a NOR gate 142. The output of the NAND gate 134 is also amplified by an inverting amplifier 136 to produce either the Inphase or Inphasenot signals.

The sign latch 132 includes a NAND gate 140. Each of the NAND gates 130 and 140 has an input connected to the output of the other. The NOR gate 142 also provides amended RESET and CLEAR signals to the sign latch 132 via the NAND gate 140. The output of the sign latch 132 is amplified with an inverting amplifier to produce a SIGN signal.

The FSM 42 of FIG. 3 receives the signals output by the phase comparator 40 and decides weather or not to adjust the phase of the synchronized clock signal. This is a significant departure from prior art clock synchronization circuits. In prior art clock synchronization circuits, the output signals from the phase comparator go to a low pass filter and the output of the low-pass filter is applied to the phase adjuster. However, the use of a low pass filter requires very careful circuit design and such circuits can fail if fabrication process parameters change significantly. They are also subject to drift with temperature and power supply voltage fluctuations. Furthermore, low-pass filters often require passive components that cannot be implemented on an integrated circuit. The use of a FSM to monitor the output of the phase comparator and to control the phase adjustor is a significant new contribution. Finite state machines are easier and less time consuming to design than are low-pass filters and the functions provided by an FSM are much less susceptible to fabrication process parameter variations and drift do to temperature and power supply voltage fluctuations because finite state machines are 100% digital circuits. Furthermore, no passive components are required, thus allowing complete implementation of the FSM 42 on a single chip without any off-chip components.

Figure 9:
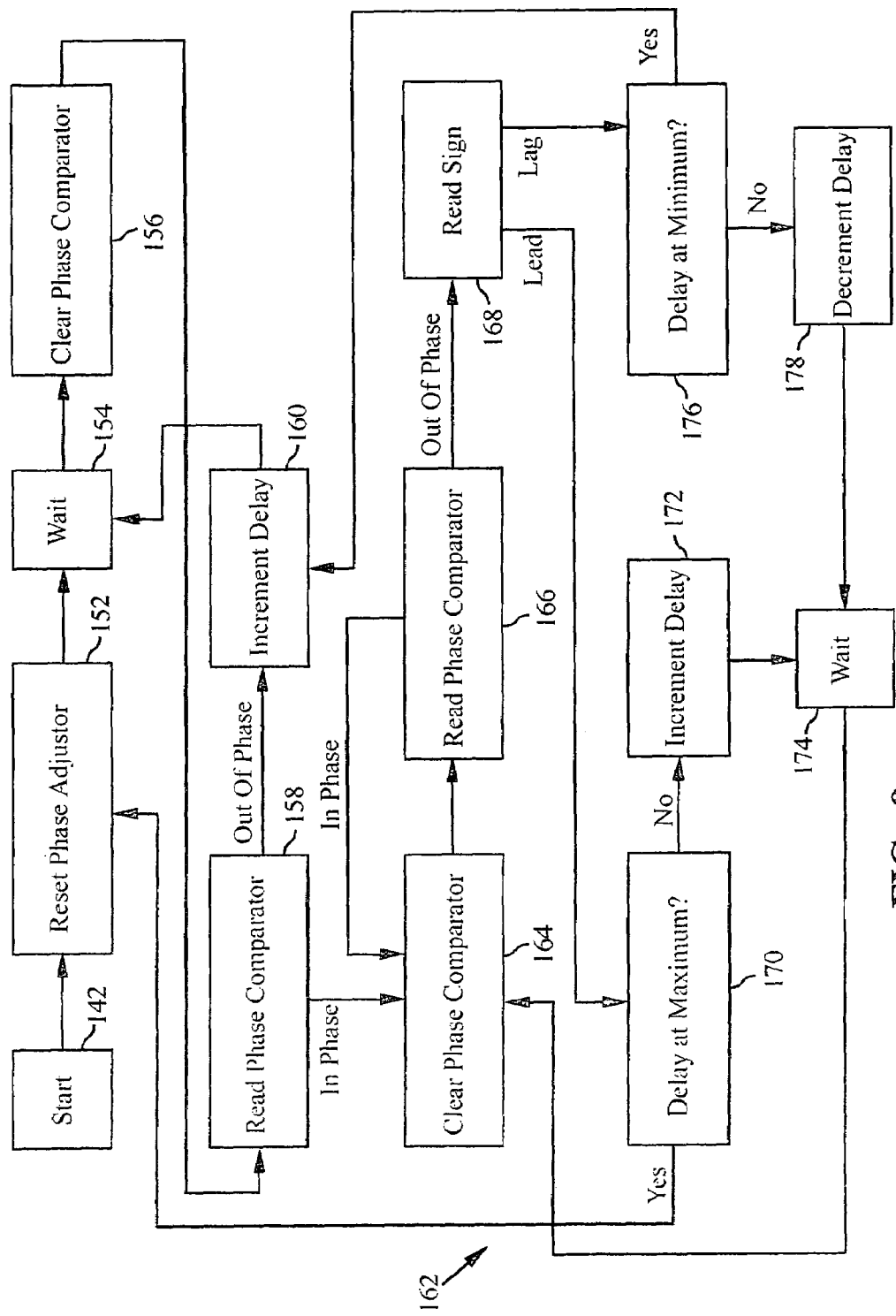
FIG. 9 is a block diagram of an automatic clock synchronization controller finite state machine.

The functionality provided by the FSM 42 is detailed in FIG. 9. Although FIG. 9 illustrates a Moore-type FSM, a Mealy-type FSM could also be used. Referring to FIG. 9, a Start state 150 initiates a Reset Phase Adjuster state 152, which might or might not cause a phase change of the synchronized clock signal. Therefore, the next state for the FSM 42 is a Wait state 154 that allows time for any phase changes to propagate through the cascade of clock synchronization buffers. After the wait time has elapsed, a Clear Phase Comparator 156 state is executed. After the phase comparator 40 is cleared, a Read Phase Comparator 158 state is performed to test the phase of the synchronized clock. If the signal is out of phase at this point, there is no choice between incrementing and decrementing the total amount of delay through the cascade of clock synchronization buffers because at this point, all buffers are set for no delay. In order to synchronize the clock at this point, delay must be added by an Increment Delay state 160. After delay is added, the Wait state 154 is repeated to allow the selected phase change time to propagate through the cascade of clock synchronization buffers.

However, if the result of the phase comparison indicates the two clock signals are synchronized, and then the FSM 42 goes into a main idle loop 162. In the main idle loop 162, the FSM 42 constantly executes a Clear Phase Comparator state 164 and then executes Read Phase Comparator state 166 to retest the phase of the synchronized clock signal. If at some point the FSM 42 sees that the synchronized clock signal has gone out of phase, it will perform a Read Sign state 168 to test the sign output from the phase comparator 40 to determine if the phase of the synchronized clock leads or lags the phase of the reference clock.

If the problem is a phase lead then additional delay needs to be added. A Delay at Maximum test 170 is done, and if the result of this test is yes, then the Reset Phase Adjust state 152 is repeated. If the result of this test is no, then an Increment Delay state 172 is performed. After adding the additional delay, the FSM 42 must go into a Wait state 174 before executing the Clear Phase Comparator state 164 to clear the phase comparator 40 and test the phase again. If additional delay needs to be added but all clock synchronization buffers have already been instructed to switch in delay, then the entire process must start over from the beginning by resetting both the phase comparator 40 and the phase adjustor 44.

If the result of checking the sign output from the phase comparator 40 indicates the phase of the synchronized clock lags the phase of the reference clock, then delay needs to be removed. A Delay at Minimum step 176 is performed, and if the result is yes, then the Increment Delay state 160 is repeated. If the result is no, then a Decrement Delay step 178 is performed to remove delay. After removing delay, the FSM 42 must go into the Wait state 174 before clearing the phase comparator 40 and testing the phase again. If delay needs to be removed, but all clock synchronization buffers have already been instructed to switch out delay, then synchronization must be attained by adding additional delay, thus the FSM 42 transitions back to the initialization loop as shown.

The purpose of the phase adjuster 44 is to translate the "increment delay" or "decrement delay" signals that come from the finite state machine into appropriate control signals for specific clock synchronization buffers. If the phase adjuster 44 receives a signal to increase delay, it locates a clock synchronization buffer that does not currently have delay switched in and instructs that buffer to switch in delay. If the phase adjuster 44 receives a signal to decrease delay, it locates a clock synchronization buffer that currently has delay switched in and instructs the buffer to switch the delay out.

Figure 10:
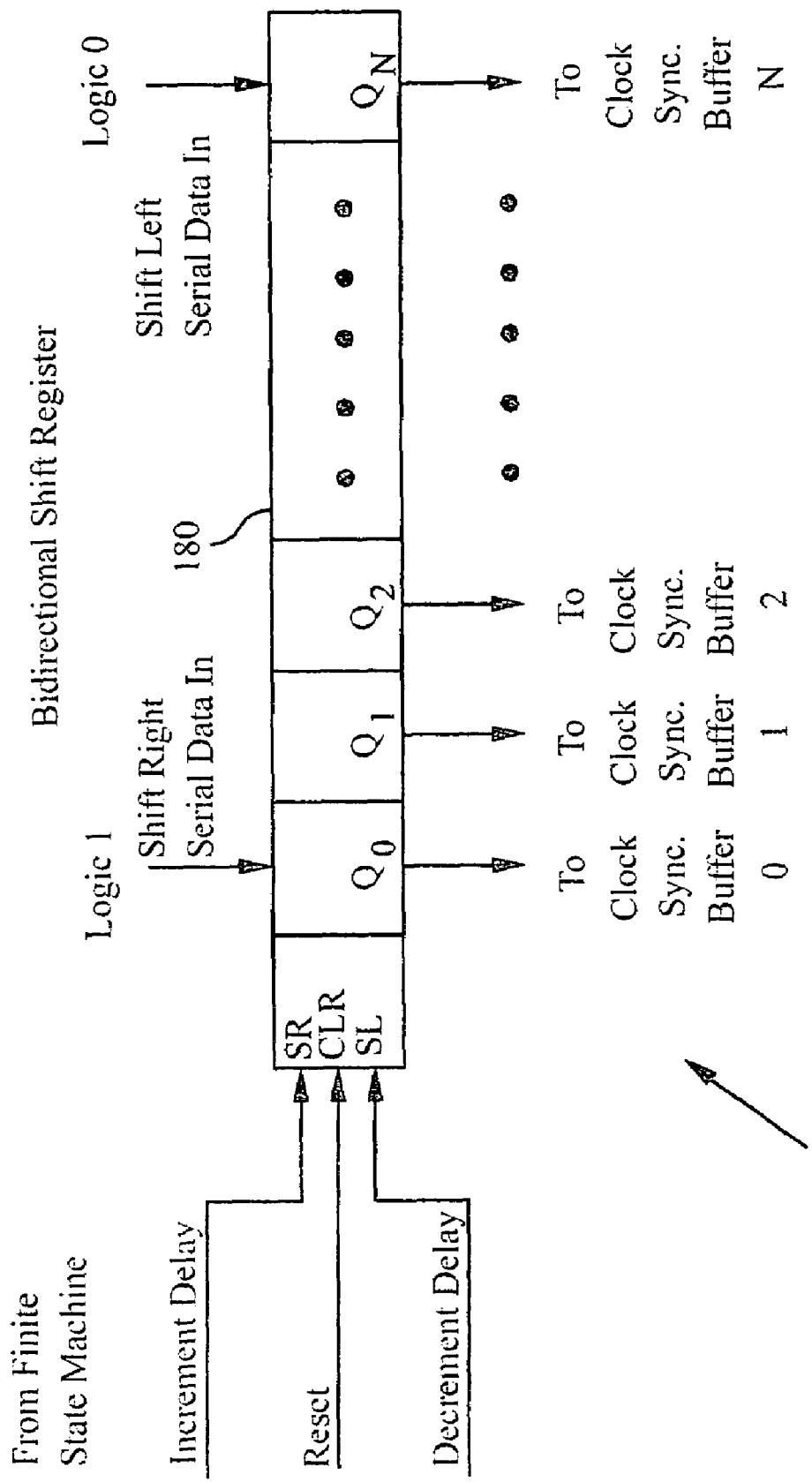
FIG. 10 is a block diagram of a phase adjuster.

A schematic diagram of the phase adjuster 44 is shown in FIG. 10. The heart of the phase adjuster 44 is a bidirectional shift register 180. However, an up/down binary counter or an up/down binary counter with a decoder could also be used instead of the bidirectional shift register. Referring to FIG. 10, a reset signal from the FSM 42 causes the shift register 180 to clear, meaning that all output bits get set to logic 0 (zero). This causes all clock synchronization buffers to switch out any delay that might have been switched in. When an Increment Delay signal is received from the FSM 42, all data in the shift register 180 is shifted one bit position to the right while the left-most bit of the shift register loads a logic 1 from the shift right serial data input. When a logic 1 is sent to a clock synchronization buffer, it causes the buffer to switch in delay, as previously described. When a Decrement Delay signal is received from the FSM 42, all data in the shift register 180 is shifted one bit position to the left while the right-most bit of the shift register loads a logic 0 from the shift left serial data input. When a logic 0 is sent to a clock synchronization buffer, it causes the buffer to switch out delay, as previously described.

The method of application of the two new clock buffer circuits and the automatic clock synchronization controller 38 is illustrated previously in FIG. 4. Referring to FIG. 4, the input clock signal is split and the signal is distributed to a non-inverting clock synchronization buffer and to the reference clock input of the automatic clock synchronization controller 38. The outputs of the buffer go to the local data processing module and to the next clock synchronization buffer in the cascade. However, the next buffer in the cascade is an inverting clock synchronization buffer instead of a non-inverting clock synchronization buffer. As the clock signal is distributed from one stage to the next, inverting and non-inverting buffers are alternated. The output of the last clock synchronization buffer is split and the signal is distributed to the synchronized clock input to the automatic clock synchronization controller 38 and to the module or circuit that provides the synchronous data to the input of the first data processing module or circuit in the pipeline, as indicated in FIG. 4. The purpose of the automatic clock synchronization controller 38 is to continuously monitor the phase relationship between the signal it receives at the reference clock input and synchronized clock input. It then adjusts the phase of the signal it receives at the synchronized clock input until the two clock signals are in phase, as described previously.

What is claimed is:

1. A clock synchronization buffer circuit for use with a counter clock flow pipelined circuit that includes a cascade of processing modules in which each processing module receives input data from a previous processing module in the cascade, processes the received data and then sends output results to a following processing module in the cascade, the clock synchronization buffer circuit being arranged to receive a clock input signal and a delay select signal and to provide delayed clock signals having a selected delay to a local processing module and to a next pipeline stage, comprising:

a selectable delay stage arranged to receive a clock input signal and a delay select signal and to output a delayed clock signal having a selected delay, the selectable delay stage comprising:

a first inverter and a second inverter connected in series, the first inverter arranged to receive the clock input signal, and the second inverter arranged to output a delayed clock signal, and a multiplexer connected to the second inverter, the multiplexer arranged to receive the delayed clock signal at a first input, the clock input signal at a second input, and the delay select signal at a third input, and to output the delayed clock signal having a selected delay, wherein the delayed clock signal output from the multiplexer is shifted in phase from the input clock signal based on the delay select signal;

a first amplifier that is a non inverting amplifier connected to the selectable delay stage and arranged to receive the delayed clock signal having a selected delay output from the multiplexer and to output a non inverted delayed clock signal having a selected delay to a local processing module in the cascade that corresponds to the clock synchronization buffer circuit; and a second amplifier that is an inverting amplifier connected to the selectable delay stage and arranged to receive the delayed clock signal having a selected delay output from the multiplexer and to output an inverted delayed clock signal having a selected delay to the next pipeline stage.

2. A clock synchronization buffer circuit for use with a counter clock flow pipelined circuit that includes a cascade of processing modules in which each processing module receives input data from a previous processing module in the cascade, processes the received data and then sends output results to a following processing module in the cascade, the clock synchronization buffer circuit being arranged to receive a clock input signal and a delay select signal and to provide delayed clock signals having a selected delay to a local processing module and to a next pipeline stage, comprising:

a selectable delay stage arranged to receive a clock input signal and a delay select signal and to output a delayed clock signal having a selected delay, the selectable delay stage comprising:

a first inverter and a second inverter connected in series, the first inverter arranged to receive the clock input signal, and the second inverter arranged to output a delayed clock signal, and a multiplexer connected to the second inverter, the multiplexer arranged to receive the delayed clock signal at a first input, the clock input signal at a second input, and the delay select signal at a third input, and to output the delayed clock signal having a selected delay, wherein the delayed clock signal output from the multiplexer is shifted in phase from the input clock signal based on the delay select signal;

a first inverting amplifier connected to the selectable delay stage and arranged to receive the delayed clock signal having a selected delay output from the multiplexer and to output a first inverted delayed clock signal having a selected delay to a local processing module in the cascade that corresponds to the clock synchronization buffer circuit; and a second inverting amplifier connected to the selectable delay stage and arranged to receive the delayed clock signal having a selected delay output from the multiplexer and to output a second inverted delayed clock signal having a selected delay to the next pipeline stage.

3. The clock synchronization buffer circuit of claim 1 wherein the delayed clock signal having the selected delay is split internal to the clock synchronization buffer circuit prior to receipt by the first amplifier that is a non inverting amplifier and by the second amplifier that is an inverting amplifier.

4. The clock synchronization buffer circuit of claim 2 wherein the delayed clock signal having the selected delay is split internal to the clock synchronization buffer circuit prior to receipt by the first inverting amplifier and by the second inverting amplifier.

\* \* \* \* \*